(12) United States Patent
Gao et al.

(10) Patent No.: US 8,011,237 B2
(45) Date of Patent: Sep. 6, 2011

(54) PIEZOELECTRIC MODULE FOR ENERGY HARVESTING, SUCH AS IN A TIRE PRESSURE MONITORING SYSTEM

(75) Inventors: Ziyang Gao, Ma Wan (HK); Man-Lung Sham, Shatin (HK); Chang Hwa Chung, Shatin (HK)

(73) Assignee: Hong Kong Applied Science and Technology Research Institute Co., Ltd., Shatin, New Territories (HK)

( * ) Notice: Subject to any disclaimer, the term of this patent is extended or adjusted under 35 U.S.C. 154(b) by 686 days.

(21) Appl. No.: 12/035,860

(22) Filed: Feb. 22, 2008

(65) Prior Publication Data
US 2009/0211353 A1 Aug. 27, 2009

(51) Int. Cl.
*B60C 23/02* (2006.01)
*G01P 15/09* (2006.01)
(52) U.S. Cl. ........................ 73/146.5; 73/514.34; 73/721
(58) Field of Classification Search ........................ None
See application file for complete search history.

(56) References Cited

U.S. PATENT DOCUMENTS

| | | | | |
|---|---|---|---|---|
| 3,233,466 A * | 2/1966 | Shaw, Jr. | ...................... | 73/514.29 |
| 4,510,484 A * | 4/1985 | Snyder | .......................... | 340/438 |
| 6,263,734 B1 * | 7/2001 | Fujii et al. | .................. | 73/514.34 |
| 6,407,484 B1 * | 6/2002 | Oliver et al. | .................. | 310/339 |
| 6,453,748 B1 * | 9/2002 | Pryor | .............................. | 73/727 |
| 6,622,559 B2 * | 9/2003 | Baba et al. | ................. | 73/514.34 |
| 6,629,462 B2 * | 10/2003 | Otsuchi et al. | ............. | 73/514.34 |
| 6,787,804 B1 * | 9/2004 | Yang | ............................... | 257/62 |
| 7,104,134 B2 * | 9/2006 | Amano et al. | .................. | 73/704 |
| 7,138,911 B2 * | 11/2006 | Tyndall | ........................ | 340/447 |
| 7,183,937 B2 * | 2/2007 | Park et al. | .................. | 340/693.1 |
| 7,260,984 B2 * | 8/2007 | Roundy et al. | ............... | 73/146.5 |
| 7,493,818 B2 * | 2/2009 | Nishihara et al. | ............... | 73/651 |
| 7,497,133 B2 * | 3/2009 | Shih et al. | ............... | 73/862.639 |
| 7,584,666 B2 * | 9/2009 | Kim et al. | ........................ | 73/727 |

FOREIGN PATENT DOCUMENTS
JP 60107726 A * 6/1985
* cited by examiner

*Primary Examiner* — Lisa M Caputo
*Assistant Examiner* — Jermaine Jenkins
(74) *Attorney, Agent, or Firm* — Berkeley Law & Technology Group, LLP

(57) ABSTRACT

Subject matter disclosed herein may relate to energy harvesting piezoelectric modules as may be used, for example, in power supplies for tire pressure monitoring systems.

30 Claims, 14 Drawing Sheets ated to piezoelectric modules for energy harvesting as may be used, for example, in power supplies for tire pressure monitoring systems.

PIEZOELECTRIC MODULE FOR ENERGY HARVESTING, SUCH AS IN A TIRE PRESSURE MONITORING SYSTEM

FIELD

Subject matter disclosed herein may relate to piezoelectric modules for energy harvesting as may be used, for example, in power supplies for tire pressure monitoring systems.

BACKGROUND

Piezoelectric energy harvesting devices may be utilized in a wide range of applications. Such energy harvesting devices may take advantage of one or more of the properties of piezoelectric materials, such as, for example, the piezoelectric material's ability to produce a voltage in response to a deformation of the material. Piezoelectric energy harvesting devices may be used in the place of batteries in some situations, such as, for example, situations where it would be inconvenient, difficult, and/or expensive to replace a battery, and where one or more forces are available to impart to the piezoelectric material in order to deform the material to generate a voltage. Tire pressure monitoring systems are an example application for piezoelectric energy harvesting devices. However, the use of piezoelectric energy harvesting devices in challenging environments such as, for example, an automobile tire in the case of a tire pressure monitoring system, may pose difficulties with regard to reliability, size, weight, cost, ease of manufacturing, and/or adequacy of voltage generation.

BRIEF DESCRIPTION OF THE FIGURES

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 5b is an illustration depicting a side view of the example embodiment of FIG. 5a;

FIG. 6b is an illustration depicting a side view of the example embodiment of FIG. 6a;

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

Reference throughout this specification to "one embodiment" or "an embodiment" means that a particular feature, structure, or characteristic described in connection with the embodiment is included in at least one embodiment of claimed subject matter. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

The term "and/or" as referred to herein may mean "and", it may mean "or", it may mean "exclusive-or", it may mean "one", it may mean "some, but not all", it may mean "neither", and/or it may mean "both", although the scope of claimed subject matter is not limited in this respect.

Figure 1A:
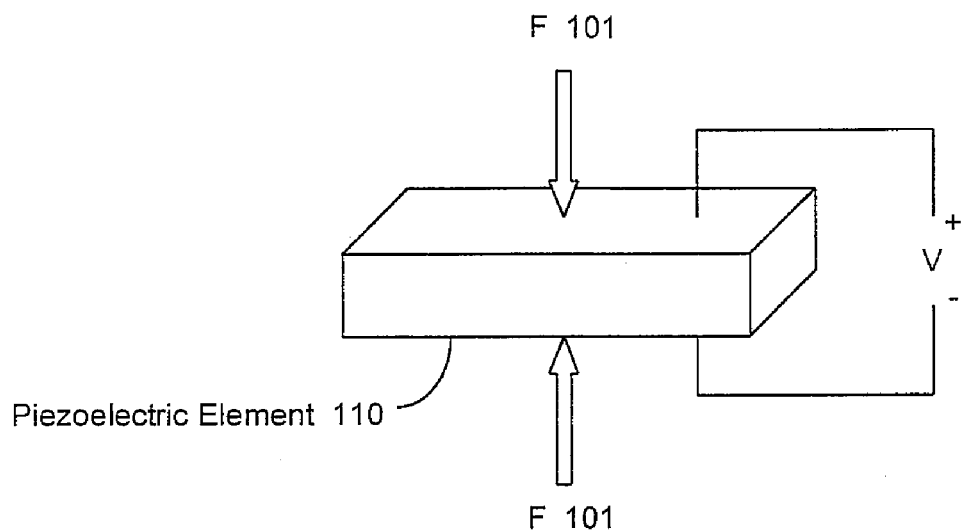
FIG. 1a is an illustration depicting an example piezoelectric element generating a voltage in response to a compressive force.

FIG. 1a is an illustration depicting an example piezoelectric element 110 generating a voltage V in response to a compressive force (F) 101. In general, one property of piezoelectric materials is that a voltage may be produced across the material in response to an applied force. The applied force may cause a change in dimension of the piezoelectric material, and this change in dimension may result in a decrease in the separation of the cations and anions (positively and negatively charges ions, respectively) that make up the crystalline structure observed in piezoelectric materials. The decrease in separation between the cations and anions results in the generated voltage. Similarly, a voltage applied to a piezoelectric material may cause a change in dimension of the material. For the example of FIG. 1a, applied force F 101 results in a compression of piezoelectric element 110. However, the compressive force is merely one possible example of how a force my be applied to a piezoelectric element. A piezoelectric module that generates a voltage in response to a compressive applied force may be said to operate in a "compressive" mode.

Figure 1B:
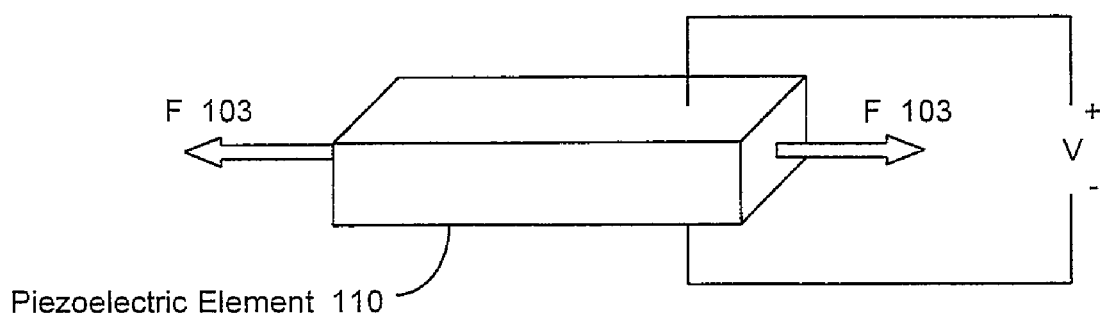
FIG. 1b is an illustration depicting an example piezoelectric element generating a voltage in response to a force that may cause the piezoelectric material to flex and/or stretch.

FIG. 1b is an illustration depicting example piezoelectric element 110 generating a voltage in response to a force (F) 103 that may cause the piezoelectric material to flex and/or stretch. As with the compressive force discussed above, an applied force that causes the piezoelectric element to stretch and/or flex may result in a change in the spacing between cations and anions in the crystalline structure of the piezoelectric material, and a voltage may be generated in response. A piezoelectric module that generates a voltage in response to a force that causes the piezoelectric material to stretch and/or flex may be said to operate in a "stretch" mode.

As discussed above, the use of piezoelectric energy harvesting devices in challenging environments such as, for example, an automobile tire in the case of a tire pressure monitoring system, may pose difficulties with regard to reliability, size, weight, cost, ease of manufacturing, and/or adequacy of voltage generation.

In general, an example embodiment of a piezoelectric module that may be utilized in a wide range of energy harvesting applications may comprise one or more piezoelectric elements that may operate in both the compressive and stretch modes of operation. That is, for one or more embodiments, the one or more piezoelectric elements may generate one or more voltages in response to compressive forces applied to the one or more piezoelectric elements, and may further generate one or more voltages in response to applied forces that may cause the one or more piezoelectric elements to stretch and/or flex. By operating in both the compressive and stretch modes of operation as opposed to a single mode of operation, greater energy harvesting abilities may be realized. Other possible advantages over a single mode approach may include, but are not limited to, cost, reliability, efficiency, and/or size, to cite a few examples.

Figure 2:
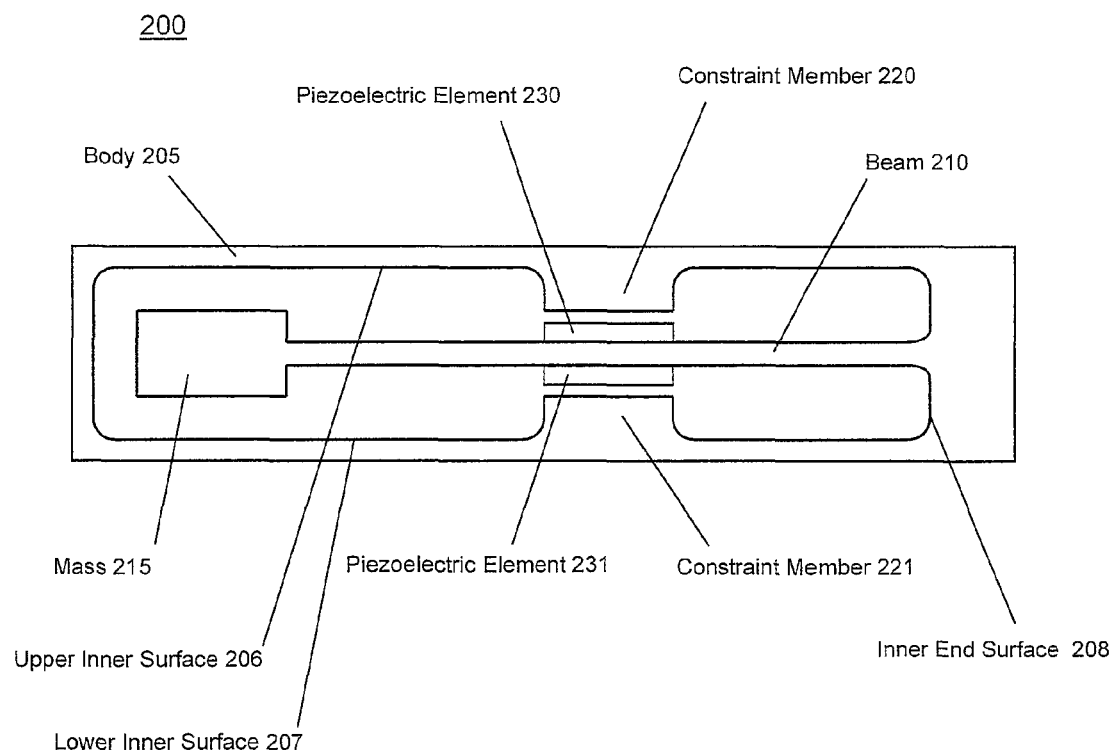
FIG. 2 is an illustration depicting a side view of an example embodiment of a piezoelectric module.

FIG. 2 is an illustration depicting a side view of an example embodiment of a piezoelectric module 200 that may be used in energy harvesting applications, for example. For this example, module 200 may comprise a body 205 that may comprise a substantially hollow structure, as depicted in FIG. 2. Body 205 may comprise an upper inner surface 206 and a lower inner surface 207, as shown in FIG. 2. Body 205 may also comprise an inner end surface 208. Of course, this is merely an example of a body structure, and the scope of claimed subject matter is not limited in this regard. For an embodiment, the total dimensions of piezoelectric module 200 may comprise approximately 30 mm×10 mm×10 mm, although, again, the scope of claimed subject matter is not limited in respect.

Module 200 for this example embodiment may comprise a beam 210 that has one end fixed to inner end surface 208. In on or more embodiments, beam 210 may comprise a part of body 205, while in other embodiments beam 210 may comprise a separate element fixed in some fashion to inner end surface 208. For an embodiment, beam 210 may extend at least part way into inner end surface 208 and at least part way into body 205, although the scope of claimed subject matter is not limited in this regard. Also for an embodiment, beam 210 may comprise, at an end opposite of the end fixed to inner end surface 208, a mass 215. The characteristics of mass 215 may be selected according to desired vibrational characteristics of beam 210. That is, the characteristics of mass 215 may determine, at least in part, how beam 210 may react to imparted accelerations. The characteristics of mass 215 may be selected to adjust the resonant frequency of beam 210, for example.

Module 200 for this example embodiment may further comprise a piezoelectric element 230 and a piezoelectric element 231. Although two piezoelectric elements are shown in this example, other embodiments in accordance with claimed subject matter may include fewer than or more than two piezoelectric elements. For this example, piezoelectric element 230 may be fixed to a side of beam 210 facing upper inner surface 206, and piezoelectric element 231 may be fixed to a side of beam 210 facing lower inner surface 207. Further, for an embodiment, body 205 may comprise constraint members 220 and 221 extending from upper inner surface 206 and lower inner surface 207, respectively. Constraint members 220 and 221 may restrict the motion of beam 210, and may also provide platforms against which piezoelectric elements 230 and 231 may be compressed. Also, for this example embodiment, constraint members 220 and 221 may act as fulcrum points around which beam 210 may flex if vertical forces are applied to beam 210. Further, for this example, a bend or flexion of beam 210 may result in a flexion and/or stretching of one or both of piezoelectric elements 230 and 231.

Constraint members 210 for this example embodiment may comprise a portion of body 205. However, other embodiments are possible where constraint members 220 and 221 are not formed as part of body 205, but are separately formed elements that may or may not be formed of the same or similar material as body 205. For an embodiment, body 205 may comprise a plastic material, although the scope of claimed subject matter is not limited in this respect. Characteristics to consider in selecting a material for body 205 may include, for example, cost, durability, ease of manufacture, weight, and/or electrical conductivity. In an embodiment, body 205 may comprise a relatively light weight, non-conductive material, such as, for example, plastic. For one or more embodiments, the body may comprise polybutylene terephtalate (PBT). For another embodiment, the body may comprise polyethylene terephtalate (PET). However, these are merely example body materials, and the scope of claimed subject matter is not limited in this respect. For an embodiment, the total weight of piezoelectric module 200 may be approximately 30 g, although, again, the scope of claimed subject matter is not limited in this respect.

As described above, if a piezoelectric element is subjected to a compressive force, a voltage may be induced across the element. Also, if the piezoelectric element is subjected to flexion, an additional voltage may be induced across the element. For example piezoelectric module 200, body 205 may be subjected to various accelerations, depending on the application. In some applications, such as, for example, a tire pressure monitoring system, body 205 may be subjected to vibrations. These vibrations may be imparted to beam 210, and beam 210 may, as a result, vibrate and/or oscillate. As a result of the vibrations/oscillations of beam 210, piezoelectric elements 230 and 231 may be compressed against constraint members 220 and 221, respectively, thereby generating a first voltage, and piezoelectric elements 230 and 231 may experience flexion due to a bending back and forth of beam 210, thereby generating a second voltage. Thus, example piezoelectric module 200 may be said to operate in both compressive and stretch modes of operation.

Not shown in FIG. 2 are electrical leads (for example, wires) that may be coupled to one or more sides of piezoelectric elements 230 and 231. The electrical leads may, for example, couple the generated voltages to an energy storage circuit (also not shown in FIG. 2).

Beam 210 may, for this example embodiment, be formed of a conductive metal material. Steel and/or aluminum may comprise two example materials that may be used to form beam 210, although the scope of claimed subject matter is not limited in this respect. Of course, non-metallic embodiments of beam 210 are also possible. For an embodiment, beam 210 may comprise a conductive, metallic material, and beam 210 may serve as a ground path for the piezoelectric elements 230 and 231. Piezoelectric elements 230 and 231 may, for an embodiment, be fixed to beam 210 by way of a conductive epoxy, although the scope of claimed subject matter is not limited in this regard. Also, for an embodiment, constraint members 220 and 221 may comprise, at least in part, an electrically insulating material to guard against short circuits between the two sides of each of the piezoelectric elements should body 205 and beam 210 be formed of conductive materials.

For the example embodiments described herein, the piezoelectric elements, such as, for example, elements 230 and 231 discussed above, may comprise one or more ceramic piezoelectric materials. Further, in on or more embodiments, the piezoelectric elements may be formed of bulk piezoelectric materials, although the scope of claimed subject matter is not limited in these respects. For one or more embodiments, such as, for example, in a tire pressure monitoring system, the piezoelectric material may be selected according to its ability to withstand the harsh conditions that may exist inside of an automobile tire, wherein the piezoelectric module is perhaps coupled to a rim of a wheel on which the tire is mounted. Temperatures inside of the tire may range from approximately −40° to 125° C. At least some bulk ceramic piezoelectric materials may exhibit the characteristics to withstand these temperature conditions. However, bulk ceramic is merely an example type of piezoelectric material, and the scope of claimed subject matter is not limited in this respect.

As used herein, the term "bulk" as it is used in relation to piezoelectric materials is meant to denote a class of piezoelectric materials that have thicknesses of greater than approximately 500 nanometers. Also, for an embodiment, the bulk ceramic material may comprise lead zirconate titanate (PZT), perhaps, for example, PZT4 and/or PZT5h, although again, the scope of claimed subject matter is not limited in this respect. For an embodiment, the total area of the piezoelectric elements may be approximately 10 mm×10 mm. This is merely an example area, however, and the scope of claimed subject matter is not limited in this respect.

The example embodiment of piezoelectric module 200 depicted in FIG. 2 represents merely an example arrangement of elements and materials, and a range of other embodiments are possible, including, but not limited to, the further examples discussed below.

Figure 3:
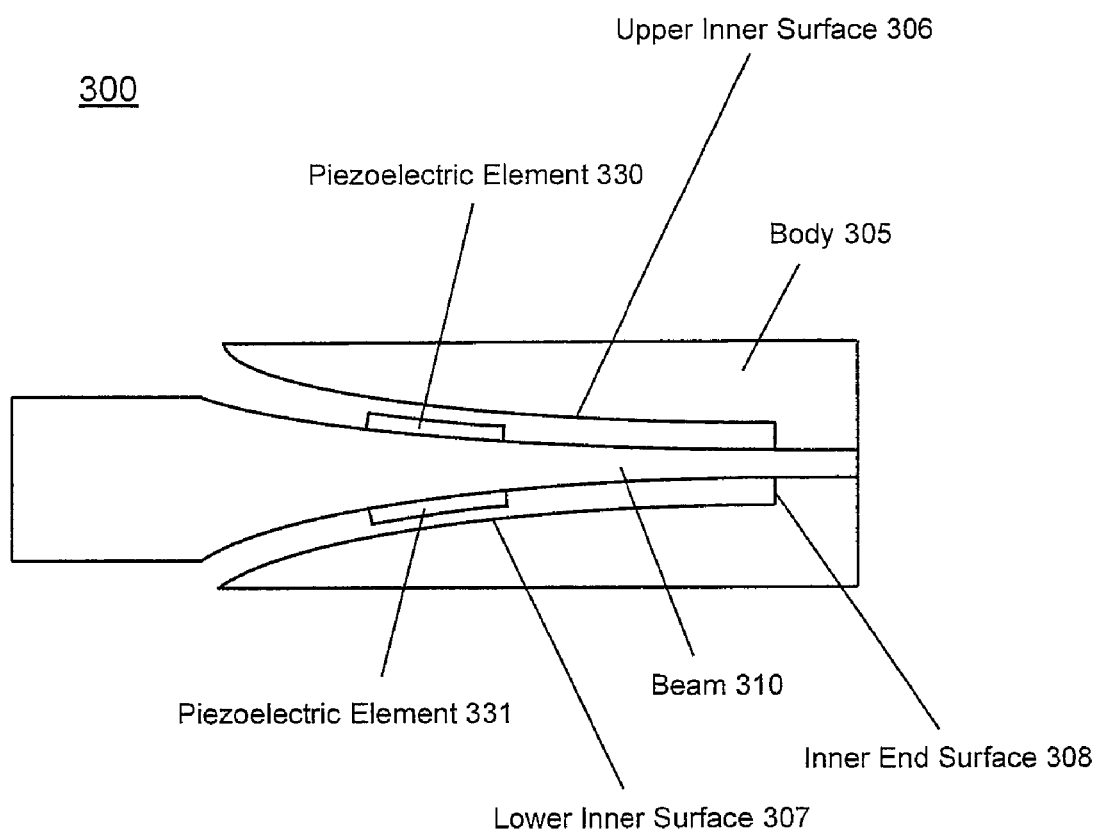
FIG. 3 is an illustration depicting a side view of an additional example embodiment of a piezoelectric module.

FIG. 3 is an illustration depicting a side view of an example embodiment of a piezoelectric module 300. For this example, module 300 may comprise a body 305 that may comprise a substantially hollow structure with an open end, as depicted in FIG. 3. Body 305 may comprise an upper inner surface 306 and a lower inner surface 307, as shown in FIG. 3. Body 305 may also comprise an inner end surface 308. Of course, this is merely an example of a body structure, and the scope of claimed subject matter is not limited in this regard.

Module 300 for this example embodiment may comprise a beam 310 that has one end fixed to inner end surface 308. In one or more embodiments, beam 310 may comprise a part of body 305, while in other embodiments beam 310 may comprise a separate element fixed in some fashion to inner end surface 308. For an embodiment, beam 310 may extend at least part way into inner end surface 308 and at least part way into body 305, although the scope of claimed subject matter is not limited in this regard. For the example depicted in FIG. 3, beam 310 may extend at least substantially through body 305. Also for this example embodiment, beam 310 comprises a largely tapered shape, as perhaps illustrated in FIG. 3. Of course, beam 310 may comprise any of a wide range of shapes, and the scope of claimed subject matter is not limited in this respect. Further, the shape of beam 310 may be selected according to desired vibrational characteristics of beam 310, in one or more embodiment.

Module 300 for this example embodiment may further comprise a piezoelectric element 330 and a piezoelectric element 331. Although two piezoelectric elements are shown in this example, other embodiments in accordance with claimed subject matter may include fewer than or more than two piezoelectric elements. For this example, piezoelectric element 330 may be fixed to a side of beam 310 facing upper inner surface 306, and piezoelectric element 331 may be fixed to a side of beam 310 facing lower inner surface 307. Further, in contrast to the one or more embodiments described above in connection with FIG. 2, module 300 for this example does not incorporate constraint members. Rather, upper inner surface 306 and lower inner surface 307 may serve as constraining members, acting to limit the range of motion of beam 310 and to provide surfaces against which piezoelectric elements 330 and 331 may be compressed. Further, for this example, a bend or flexion of beam 310 may result in a flexion and/or stretching of one or both of piezoelectric elements 330 and 331.

For an embodiment, body 305 may comprise a plastic material, although the scope of claimed subject matter is not limited in this respect. As with other embodiments discussed above, characteristics to consider in selecting a material for body 305 may include, for example, cost, durability, ease of manufacture, weight, and/or electrical conductivity. In an embodiment, body 305 may comprise a relatively light weight, non-conductive material, such as, for example, plastic.

As with the example embodiments described above in connection with FIG. 2, beam 310 may vibrate and/or oscillate in response to accelerations imparted to body 305, for example. As a result of the vibrations/oscillations of beam 310, piezoelectric elements 330 and 331 may be compressed against the inner surfaces of body 305, thereby generating a first voltage, and piezoelectric elements 230 and 231 may also experience flexion due to a bending back and forth of beam 310, thereby generating a second voltage. The voltages may be coupled to an energy storage circuit (not shown) by one or more electrical leads (also not shown). As with module 200, discussed above, example piezoelectric module 300 may be said to operate according to both compression and stretch modes of operation.

Beam 310 may, for this example embodiment, be formed of a conductive metal material, such as, for example, steel and/or aluminum, although the scope of claimed subject matter is not limited in this respect. Of course, non-metallic embodiments of beam 310 are also possible. For an embodiment, beam 310 may comprise a conductive, metallic material, and beam 310 may serve as a ground path for the piezoelectric elements 330 and 331. Piezoelectric elements 330 and 331 may, for an embodiment, be fixed to beam 310 by way of a conductive epoxy adhesive, although the scope of claimed subject matter is not limited in this regard.

Figure 4:
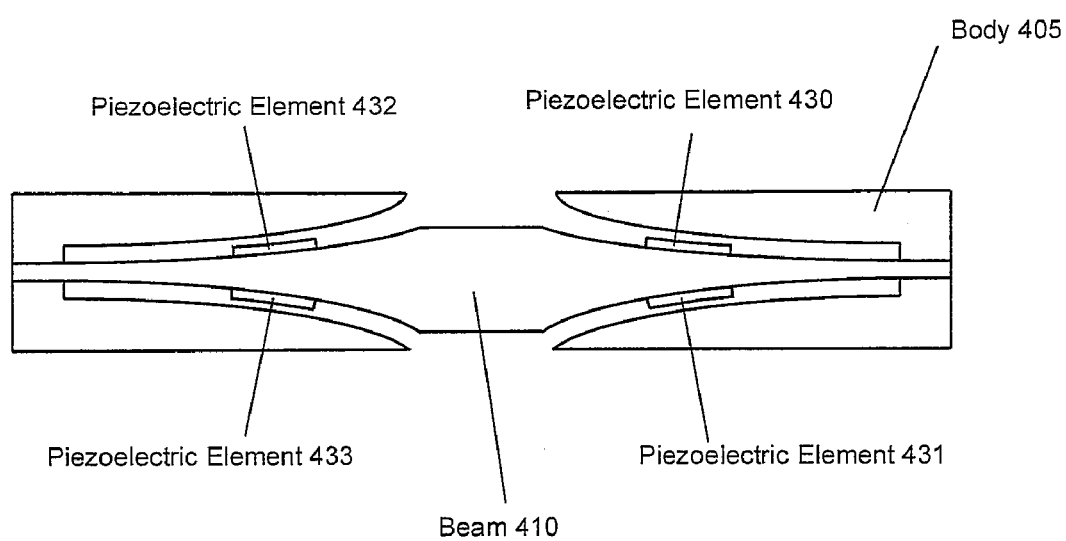
FIG. 4 is an illustration depicting a side view of a further example embodiment of a piezoelectric module.

FIG. 4 is an illustration depicting a side view of a further example embodiment of a piezoelectric module 400. Module 400 for this example maintains at least some of the characteristics of the example embodiments described above in connection with FIG. 3. For this example, module 400 comprises a body 405 that may comprise essentially the same structure as body 305 discussed above, although body 405 for this example comprises two halves. Further, although the example depicted in FIG. 4 shows body 405 has comprising two discrete halves, in one or more embodiments the two halves may comprise a single assembly.

Module 400 may further comprise a beam 410. Beam 410 may comprise some or all of the characteristics discussed above in connection with beam 310, although the scope of claimed subject matter is not limited in these respects. Further, for this example, beam 410 may be fixed at both ends to body 405.

Also, for this example embodiment, module 400 may comprise four piezoelectric elements (elements 430-433), rather than the two elements described above in connection with FIG. 3. However, embodiments in accordance with claimed subject matter may include fewer than or more than four piezoelectric elements, and the scope of claimed subject matter is not limited in this respect. By increasing the amount of piezoelectric elements, a corresponding increase in voltage generation properties may be experienced in at least some circumstances.

Figure 5A:
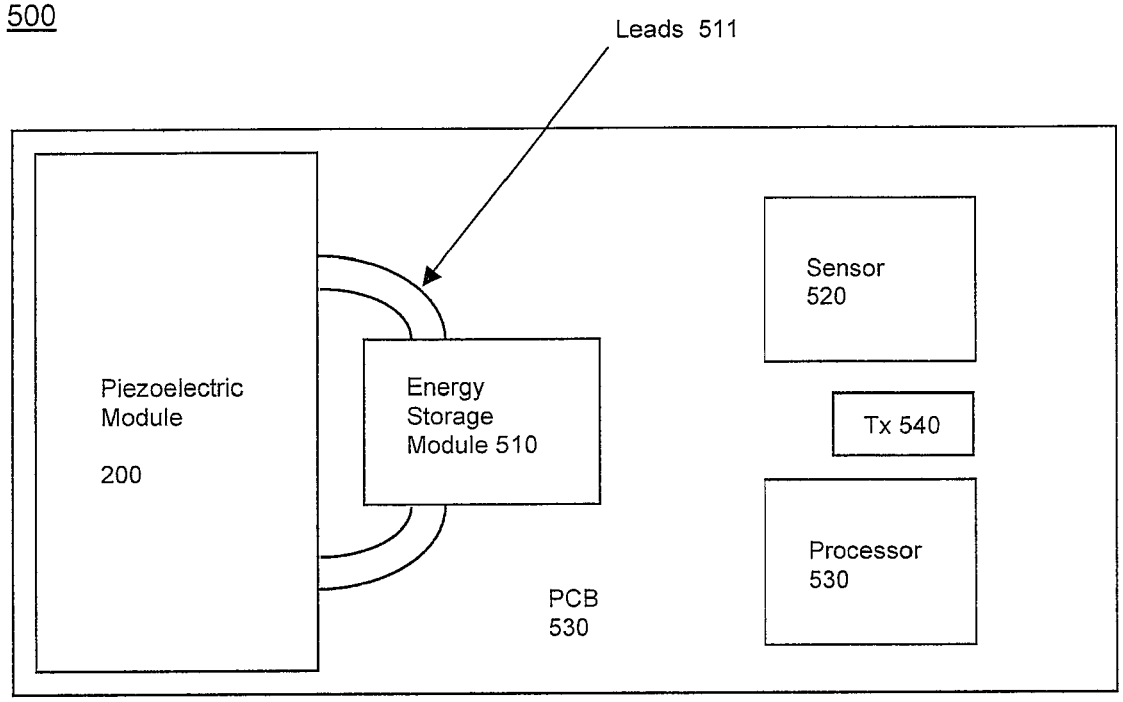
FIG. 5a is an illustration depicting a top view of an example embodiment of a sensor module comprising a piezoelectric module.
Figure 5B:
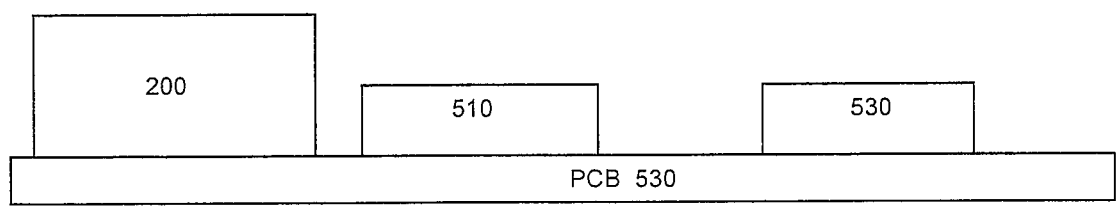

FIG. 5a is an illustration depicting a top view of an example embodiment of a sensor module 500 comprising a piezoelectric module 200. FIG. 5b provides a side view of sensor module 500. Sensor module 500 may comprise any of a wide range of sensor module types. In one or more embodiments, sensor module 500 may comprise a tire pressure monitoring system, although the scope of claimed subject matter is not limited in this respect. For an embodiment, sensor module 500 may have dimensions of 40 mm×30 mm×20 mm, with a weight of less than approximately 50 g. However, these are merely example dimensions, and the scope of claimed subject matter is not limited in this respect.

Piezoelectric module 200 for this example may comprise a module similar to that discussed above in connection with FIG. 2, although again, the scope of claimed subject matter is not limited in this regard. Sensor Module 500 may comprise a printed circuit board (PCB) 530, upon which piezoelectric module 200 may be mounted. Although example module 500 comprises a printed circuit board as a substrate, other embodiments are possible using any of a wide range of substrate materials, including, but not limited to, plastic and/or metal.

For this example, PCB 530 may comprise signal traces that may couple the various components of module 500. For example, PCB 530 may comprise traces that couple piezoelectric module 200 to an energy storage module 510. In another embodiment, piezoelectric module 200 may be coupled to energy storage module 510 by way of one or more electrical leads 511. However, these are merely examples of how energy gathered from module 200 may be transferred to energy storage module 510, and the scope of claimed subject matter is not limited in this respect.

Energy storage module 510 may comprise any of a wide range of energy storage devices and/or circuits. In an example embodiment, energy storage module 510 may comprise, at least in part, a capacitor. In another embodiment, energy storage module 510 may comprise a rechargeable battery. However, these are merely examples of energy storage devices and/or circuits, and the scope of claimed subject matter is not limited in these respect.

Module 500 for this example also comprises a sensor 520. For an embodiment, sensor 520 may comprise a tire pressure sensor. However, the tire pressure sensor is merely an example sensor type, and the scope of claimed subject matter is not limited in this respect. Sensor module 500 may also comprise a processor 530. Processor 530 may comprise any of a wide range of devices capable of executing instructions, including, by way of non-limiting example, a microcontroller.

Further, module 500 may comprise a radio transmitter (Tx) 540 to transmit sensor information to a remote receiver. In the case of a tire pressure monitoring system, module 500 may be mounted to a wheel in a position to sense air pressure within a tire mounted to the wheel. Information gathered from measurements taken by sensor 520 may be processed by processor 530 and/or may be transmitted to the remote receiver that, for one or more embodiment, may be located outside of the tire.

In an embodiment, processor 530 may be capable of executing instructions that may direct the processor to perform various functions associated with tire pressure monitoring systems. Of course, this is merely an example of the type of instructions that may be executed by processor 530, and the scope of claimed subject matter is not limited in these respects. Instructions for processor 530 may be stored, for one or more embodiments, in a machine readable medium, although again, the scope of claimed subject matter is not so limited. In an embodiment, the instructions may be stored in a non-volatile storage device (not shown) on module 500.

Although example sensor module 500 is depicted in FIG. 5a as having a particular composition and arrangement of components, with piezoelectric module 200 mounted to the top of PCB 530, a wide range of other embodiments are possible using any of a wide range of components and/or arrangements, for a wide range of possible applications. The tire pressure monitoring system described herein is merely an example system, and the scope of claimed subject matter is not limited in this respect. Further, the location of piezoelectric module 200 is merely an example position, and other arrangements are possible, such as, for example, mounted to the underside of a PCB or other substrate as described below.

Figure 6A:
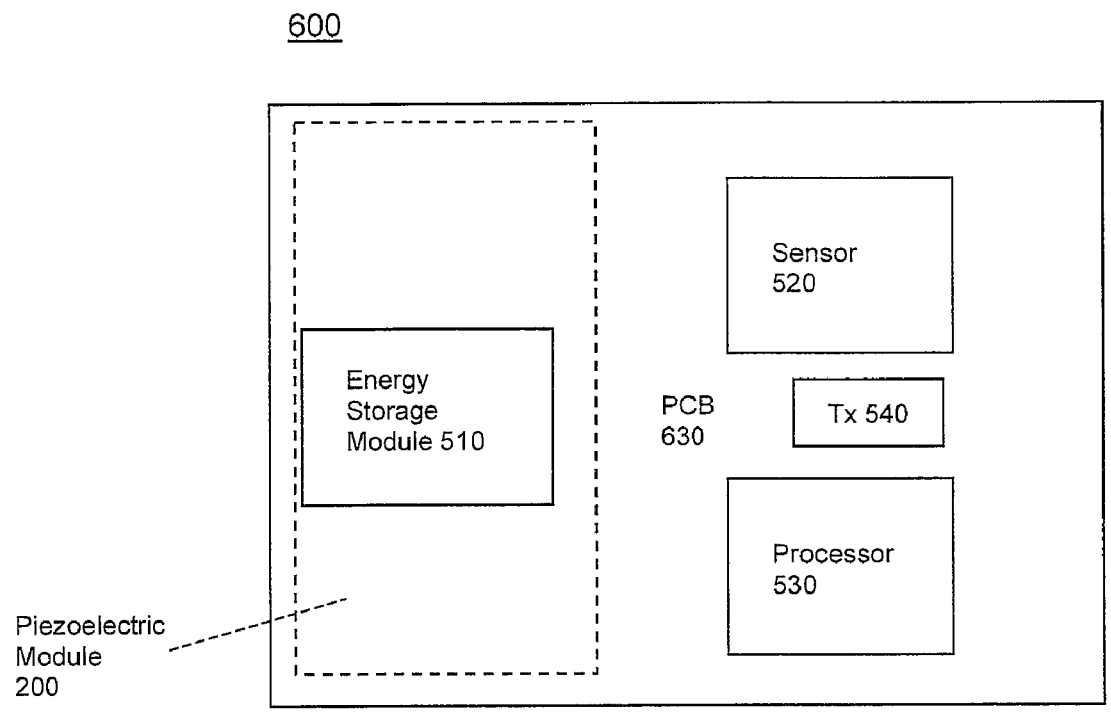
FIG. 6a is an illustration depicting a top view of an additional example embodiment of a sensor module comprising a piezoelectric module.
Figure 6B:
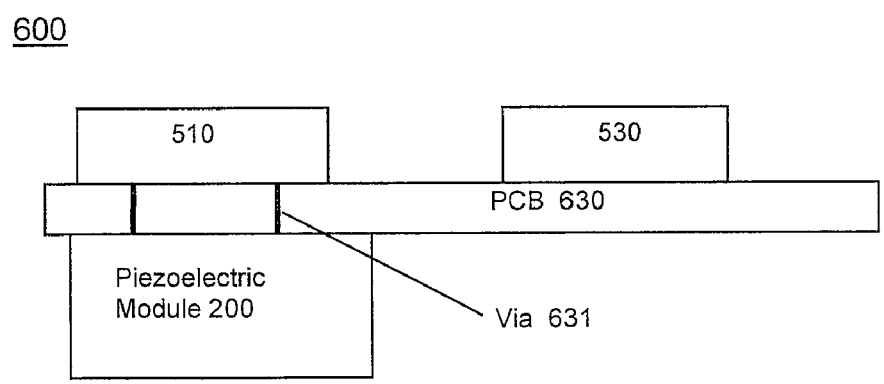

FIG. 6a is an illustration depicting a top view of an additional example embodiment of a sensor module 600 comprising piezoelectric module 200. FIG. 6b provides a side view of module 600. In at least some respects, module 600 shares some of the characteristics of sensor module 500, discussed above in connection with FIGS. 5a and 5b, including, for example, sensor 520, transmitter 540, and processor 530. For example module 600, however, piezoelectric module 200 may be mounted to the underside of PCB 630, as depicted, for example, in FIG. 6b. As with module 500, sensor module 600 may comprise, for an example embodiment, a tire pressure monitoring module that may comprise at least part of a tire pressure monitoring system.

Positioning piezoelectric module 200 on the underside of PCB 630 may provide at least one advantage over the arrangement shown above in connection with FIGS. 5a and 5b, in that the size of PCB 630 may be reduced, and the overall footprint of module 600 may similarly be reduced. Further, the smaller PCB size may allow for a lighter weight implementation, which may be advantageous in some circumstances. Of course, the arrangement of the various components of module 600 discussed above, including piezoelectric module 200, is merely an example configuration, and the scope of claimed subject matter is not limited in these respects. Further, the orientation of piezoelectric module 200 is merely an example orientation, and other orientations are possible for other embodiments.

Another possible advantage of positioning module 200 on the underside of PCB 630 is the possibility of using vias (electrical connections passing from one side of a PCB to another side) in the PCB to connect module 200 to energy storage module 510, although again, the scope of claim subject matter is not limited in this regard.

Figure 7:
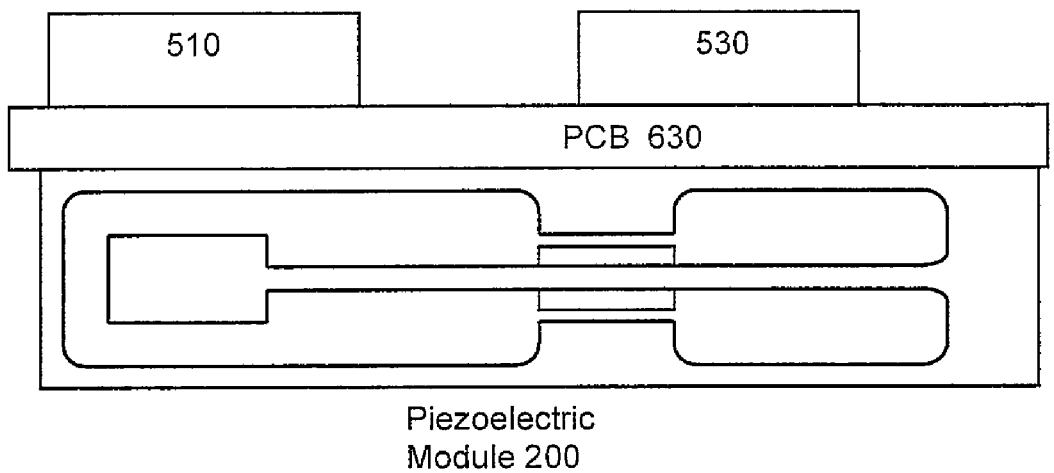
FIG. 7 is an illustration depicting a side view of an example sensor module comprising an example embodiment of a piezoelectric module.

FIG. 7 is an illustration depicting a side view of an example sensor module 700 comprising example piezoelectric module 200. In at least some respects, module 700 shares some of the characteristics of sensor module 600, discussed above in connection with FIGS. 6a and 6b, including, for example, sensor 520, transmitter 540, and processor 530. In FIGS. 6a and 6b, however, piezoelectric module 200 is depicted as being positioned in a transverse fashion across the underside of PCB 630. In the case of example module 700, piezoelectric module 200 may be positioned lengthwise in relation to PCB 630. That is, the longer dimension of module 200 corresponds with the longer dimension of PCB 630. One possible advantage of positioning module 200 in this manner may be a further reduction in the size of PCB 630, or possibly an increase in size, if desirable, of module 200. Of course, the scope of claimed subject matter is not limited in these respects. Further, as with modules 500 and 600, sensor module 700 may comprise, for an example embodiment, a tire pressure monitoring module that may comprise at least part of a tire pressure monitoring system.

Figure 8:
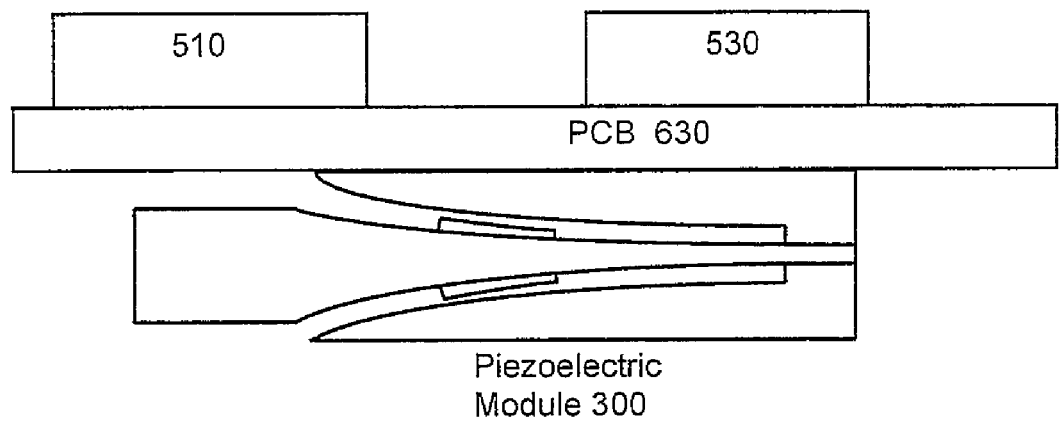
FIG. 8 is an illustration depicting a side view of an example sensor module comprising an additional example embodiment of a piezoelectric module.

FIG. 8 is an illustration depicting a side view of an example sensor module 800 comprising example piezoelectric module 300. For an embodiment, sensor module 800 may share at least some of the characteristics of modules 500, 600, and/or 700, as discussed above, including, for example, energy storage module 510, processor 530, sensor 520, and/or transmitter 540. However, for this example, the piezoelectric module comprises module 300, discussed above in connection with FIG. 3. Module 300 for this example may be positioned on the underside of PCB 630, as depicted in FIG. 8. In one example embodiment, module 800 may comprise a tire pressure monitoring system.

Figure 9:
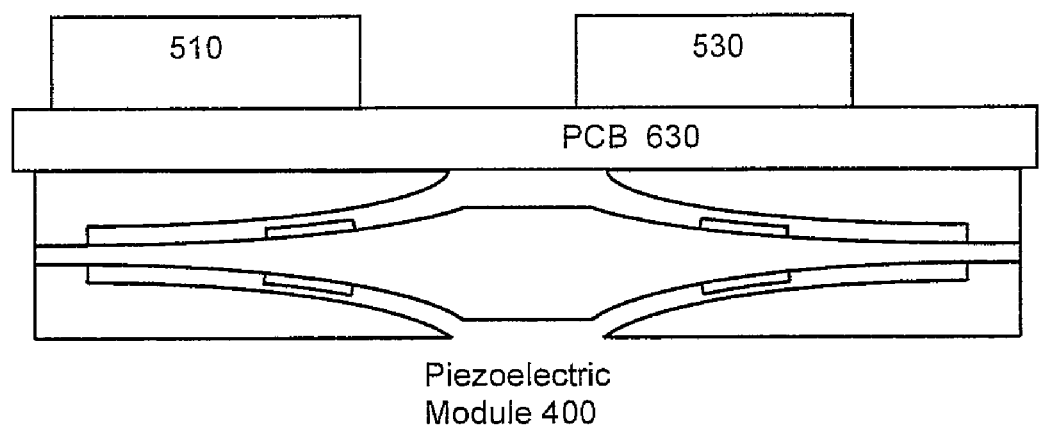
FIG. 9 is an illustration depicting a side view of an example sensor module comprising a further example embodiment of a piezoelectric module.

FIG. 9 is an illustration depicting a side view of an example sensor module 900 comprising piezoelectric module 900. For an embodiment, sensor module 900 may share at least some of the characteristics of modules 500, 600, 700, and/or 800, as discussed above, including, for example, energy storage module 510, processor 530, sensor 520, and/or transmitter 540. However, for this example, the piezoelectric module comprises module 400, discussed above in connection with FIG. 4. Module 400 for this example may be positioned on the underside of PCB 630, as depicted in FIG. 9. In one example embodiment, module 900 may comprise a tire pressure monitoring system, although the scope of claimed subject matter is not limited in this respect.

For one or more embodiments, any of the piezoelectric modules described above may further comprise a housing (not shown in order to not obscure described subject matter) that may cover the body, beam, and piezoelectric elements. The housing may comprise a metallic material, for an example embodiment. In another embodiment, the housing may comprise a plastic material. However, these are merely examples of housing materials, and the scope of claimed subject matter is not limited in this respect.

Figure 10:
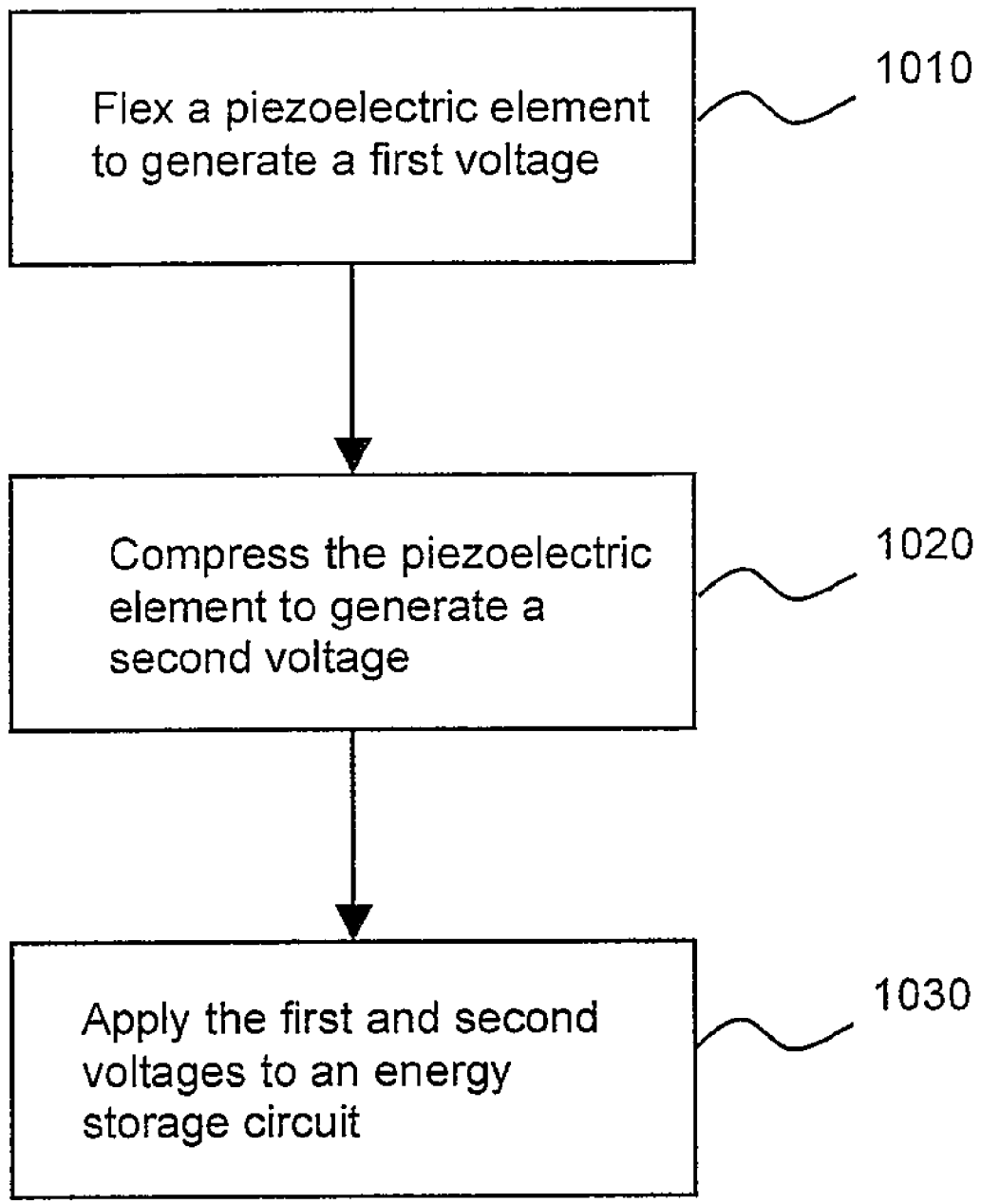
FIG. 10 is a flow diagram of an example embodiment of a method for generating voltages at a piezoelectric element.

FIG. 10 is a flow diagram of an example embodiment of a method for generating voltages at an energy harvesting piezoelectric element. At block 1010, a piezoelectric element may be flexed to generate a first voltage, and at block 1020, the piezoelectric element may be compressed to generate a second voltage. At block 130, the first and second voltages may be applied to an energy storage circuit. For an embodiment, flexing the piezoelectric element may comprise imparting an acceleration to a beam that may cause the beam to vibrate and/or oscillate. For this embodiment, the piezoelectric element may be fixed to the beam, and the flexion of the beam due to the vibration may cause the piezoelectric element to flex, resulting in the first generated voltage.

Also for this example embodiment, compressing the piezoelectric element may comprise compressing the piezoelectric element against a body or constraint member, perhaps as described above in connection with FIG. 2. However, these are merely examples of flexing and/or compressing piezoelectric elements, and the scope of claimed subject matter is not limited in these respects. Embodiments in accordance with claimed subject matter may include less than all, or more than all, of blocks 1010-1030. Further, the order of blocks 1010-1030 is merely an example order, and the scope of claimed subject matter is not limited in this respect.

Figure 11:
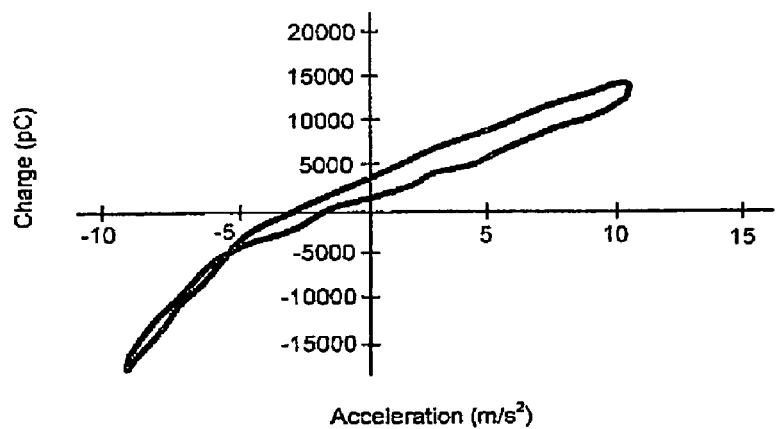
FIG. 11 is a graphical representation of example test data demonstrating a relationship between accelerations experienced by an example embodiment of a piezoelectric module and the charge developed by the piezoelectric module.

FIG. 11 is a graphical representation of example preliminary test data demonstrating a relationship between accelerations experienced by an example embodiment of a piezoelectric module and the charge developed by the piezoelectric module. The piezoelectric module under test for the example preliminary test data herein comprised a module similar to that disclosed above in connection with FIG. 2. The piezoelectric material used comprised PZT4 and PZT5h, and the total area of the piezoelectric material was 10 mm×10 mm. The piezoelectric module, similar to that shown in FIG. 2, had dimensions of 30 mm×10 mm×10 mm, and had a weight of approximately 30 g.

To perform the testing for the example of FIG. 11 and also for the example data depicted in FIGS. 12-15, as discussed below, the piezoelectric module was mounted to a conventional low-frequency vibration platform. The vibrating platform was used to impart accelerations to the piezoelectric module. For the example of FIGS. 11-13, the input to the vibrating platform ranged from approximately 20-60 Hz, imparting accelerations to the piezoelectric module ranging from approximately 0-2 g. The test conditions were meant to approximate conditions that might be experienced by the piezoelectric module operating as part of a tire pressure monitoring system mounted to an automobile wheel, inside of a tire. However, the test data discussed herein and shown in FIGS. 11-15 are merely preliminary data gathered from a prototype implemented in accordance with embodiments described herein. No representation is made herein as to the accuracy of the test data. Nevertheless, the preliminary test data may provide helpful insight into at least some of the benefits and advantages of embodiments described herein.

As can be seen from FIG. 11, at a maximum acceleration of approximately 12 m/s$^2$, the charge generated by the piezoelectric module was measured to be approximately 15000 pC.

Figure 12:
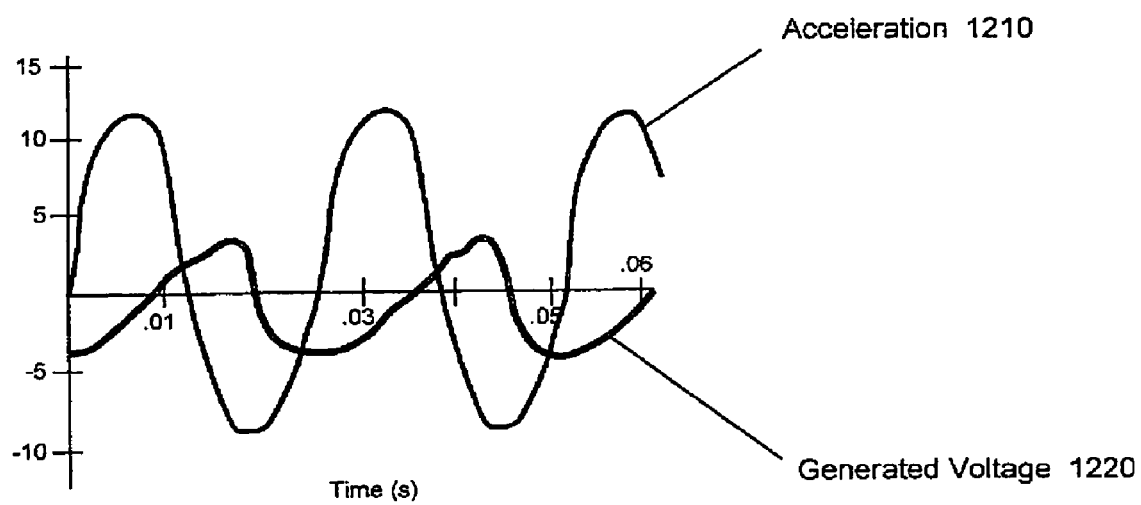
FIG. 12 is a graphical representation of example test data demonstrating voltage generated by an example embodiment of a piezoelectric module as the module is accelerated in a cyclical nature over time.

FIG. 12 is a graphical representation of additional example test data demonstrating voltage 1220 generated by the piezoelectric module as the module is accelerated (acceleration 1210) in a cyclical nature over time. The test conditions for this example were identical to those above in connection with the example of FIG. 11. As can be seen by examining FIG. 12, at a maximum acceleration of 12 m/s$^2$, the maximum generated voltage measured approximately 4 V.

Figure 13:
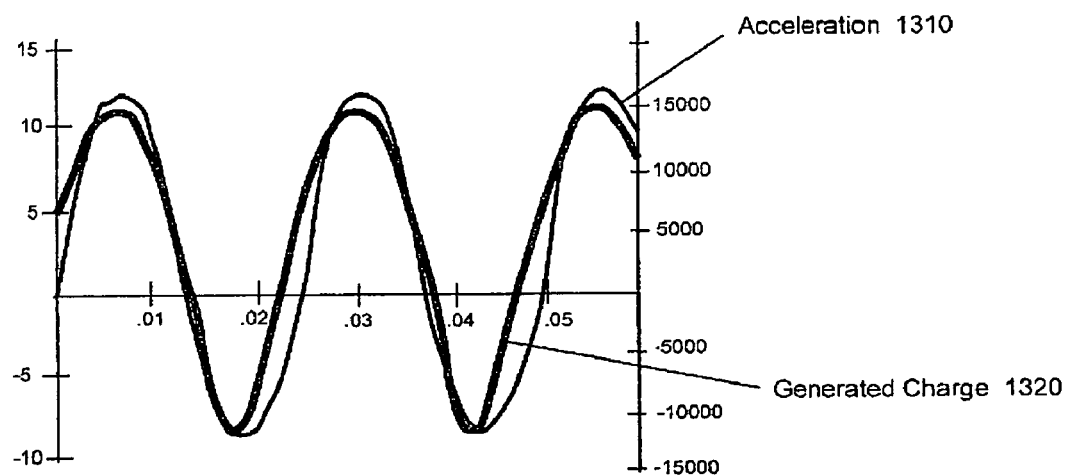
FIG. 13 is a graphical representation of example test data demonstrating charge generated by an example embodiment of a piezoelectric module as the module is accelerated in a cyclical nature over time.

FIG. 13 is a graphical representation of additional example test data demonstrating charge 1320 generated by the piezoelectric module as the module is accelerated (acceleration 1310) in a cyclical nature overtime. Again, the test conditions for this data were identical as those mentioned above in connection with FIGS. 11 and 12. As can be seen from FIG. 13, at a maximum acceleration of approximately 12 m/S$^2$, the charge generated by the piezoelectric module was measured to be approximately 15000 pC.

Figure 14:
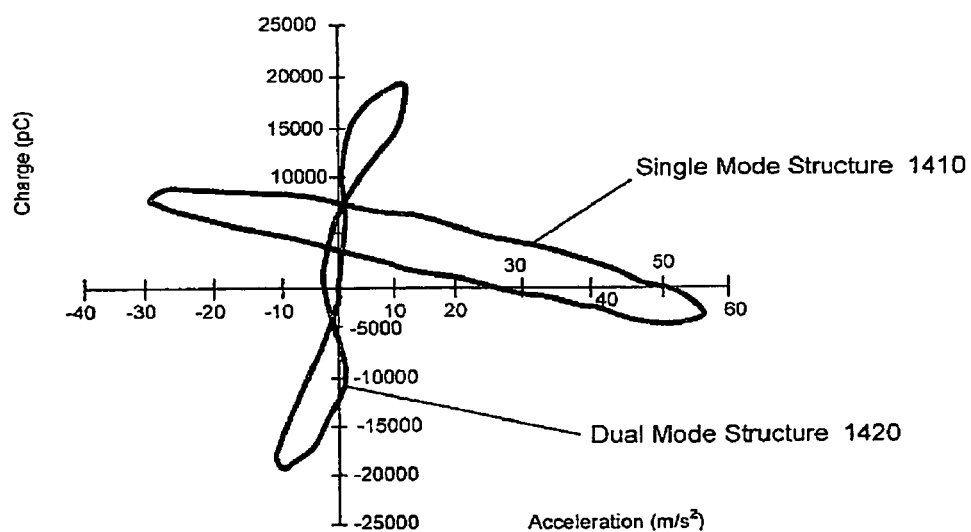
FIG. 14 is a graphical representation of example test data demonstrating a difference in charge generating abilities of single mode versus dual mode piezoelectric energy gathering structures.

FIG. 14 is a graphical representation of example test data demonstrating a difference in charge generating abilities of single mode versus dual mode piezoelectric energy gathering structures. For this example, a single mode structure comprises a structure that takes advantage of only one of the two modes of operation for piezoelectric elements. For example, a single mode structure may harvest energy generated by stretching and/or flexing the piezoelectric element, but not by compressing the piezoelectric element. The example embodiments described above in connection with FIGS. 2-10 represent dual mode structures that may harvest energy from both modes of operation (compression and stretch).

For this test, the vibrating platform oscillated at a frequency of approximately 50 Hz. As may be seen by examining FIG. 14, the single mode structure 1410 measured a maximum charge of just under 10000 pC, while the dual mode structure 1420 measured a maximum charge of approximately 20000 pC. Of course, these data are merely approximations. However, it is clear that significant charge generating improvements may be realized using dual mode structures over single mode structures.

Figure 15:
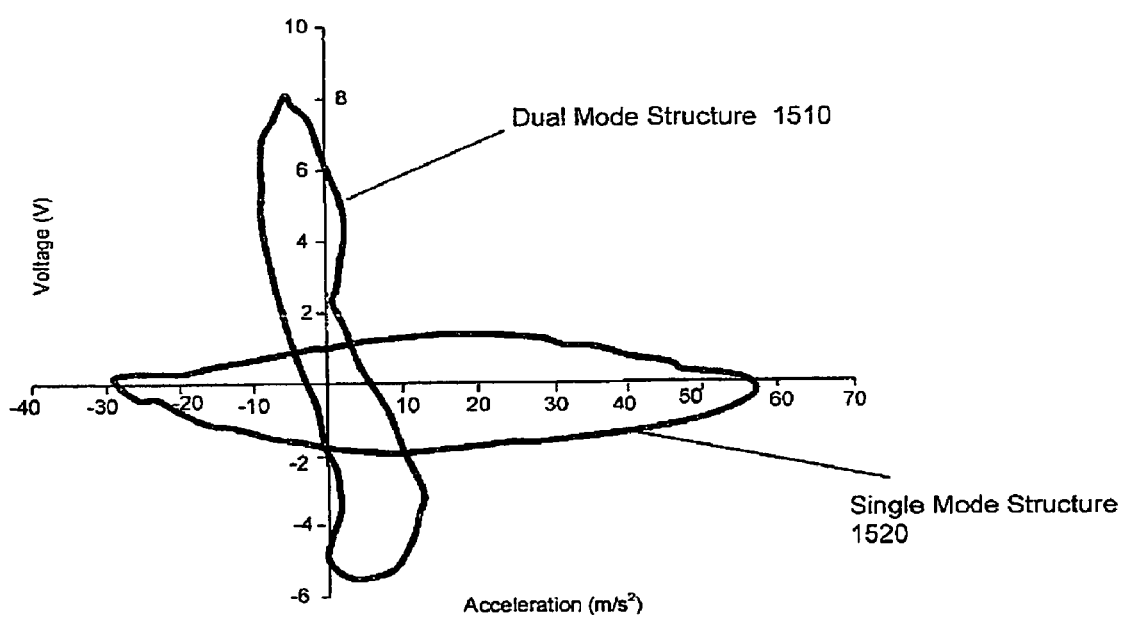
FIG. 15 is a graphical representation of example test data demonstrating a difference in voltage generating abilities of single mode versus dual mode piezoelectric energy gathering structures.

FIG. 15 is a graphical representation of additional example test data demonstrating a difference in voltage generating abilities of single mode versus dual mode piezoelectric energy gathering structures. As may be seen by examining FIG. 15, the single mode structure 1510 measured a maximum voltage of approximately 1.8 V, while the dual mode structure 1520 measured a maximum voltage of approximately 8 V. Again, while these data are merely approximations, it is clear that significant voltage generating improvements may be realized using dual mode structures over single mode structures.

Figure 16:
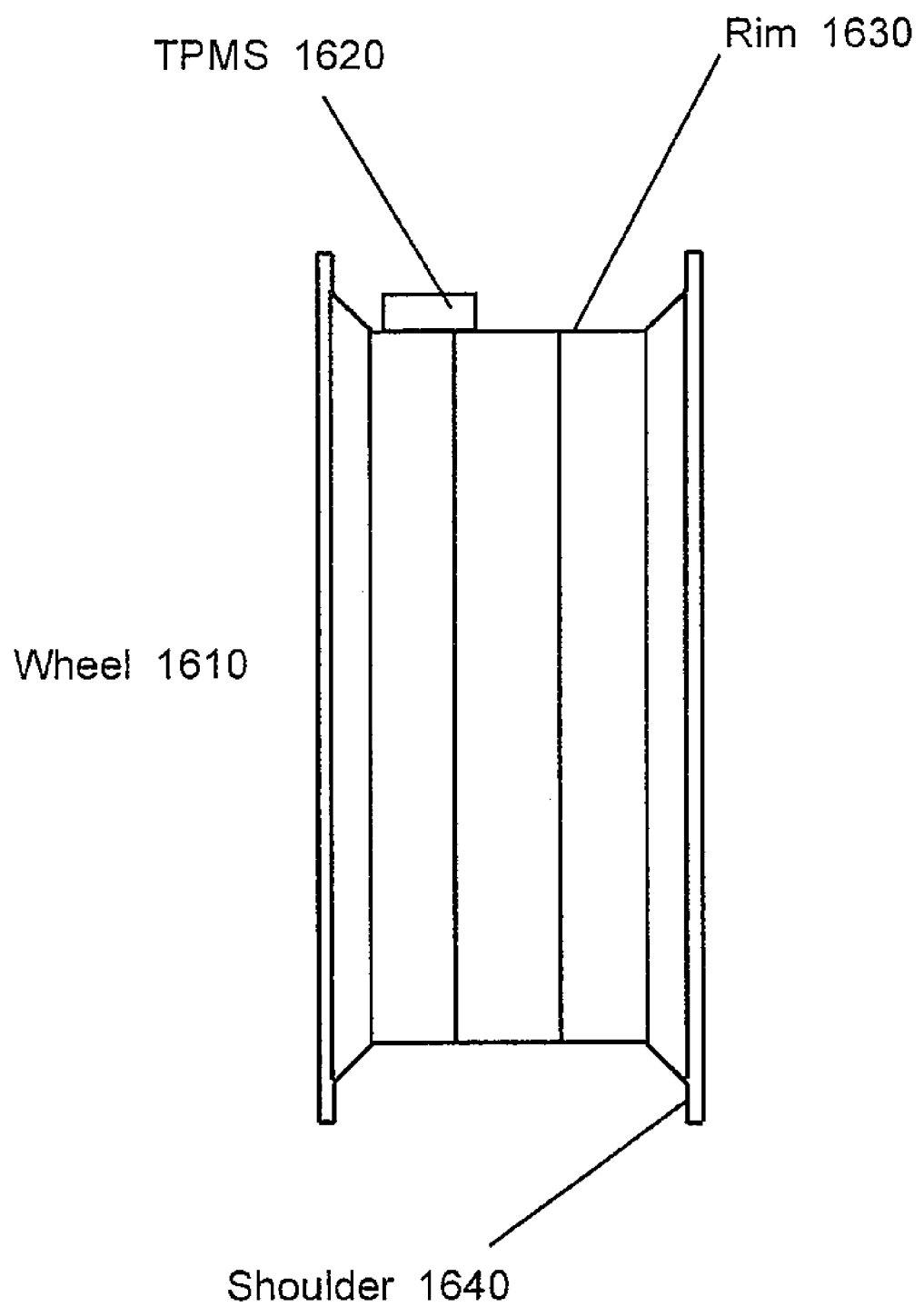
FIG. 16 is an illustration depicting an example embodiment of a tire pressure monitoring system mounted to an automobile wheel.

FIG. 16 is an illustration depicting an example embodiment of a tire pressure monitoring system (TPMS) 1620 mounted to an automobile wheel 1610, wherein wheel 1610 comprises a rim 1630 and a shoulder 1640. For this example embodiment, TPMS 1620 may comprise an example sensor module embodiment such as discussed above, for example, in connection with FIGS. 5-9. For this example embodiment, TPMS 1620 may be fixed to rim 1630, and a tire (not shown so to not obscure the embodiment) may be mounted to the rim, with shoulder 1640 providing a seal between wheel 1610 and the tire. During operation, TPMS 1620 may rotate with wheel 1610, and various accelerations may be imparted to the piezoelectric module within TPMS 1620. The piezoelectric module within TPMS 1620 may operate as described above in connection with any of the embodiments described herein to generate sufficient voltage to power the circuitry of TPMS 1620. TPMS 1620 may continually or periodically measure the air pressure in the tire, and may transmit measurement information to a receiver located somewhere outside of the tire. TPMS 1620 is merely one example of an application that may benefit from the piezoelectric module embodiments described herein. As previously mentioned, piezoelectric modules in accordance with one or more embodiments described herein may find utility in any of a wide range of applications.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

What is claimed is:

1. An apparatus, comprising:
    a body comprising a first inner end surface and an upper inner surface;
    a beam comprising a first end and a second end, the first end of the beam fixed to the first inner end surface of the body, the beam further comprising a first side facing the upper inner surface of the body, the beam to flex in response to accelerations imparted to the body; and
    a first piezoelectric element fixed to the first side of the beam, the piezoelectric element to generate a first voltage in response to flexion of the beam and further to generate a second voltage in response to compression of the first piezoelectric element against the upper inner surface of the body.

2. The apparatus of claim 1, wherein the body further comprises a lower inner surface, and wherein the upper inner surface comprises a first constraint member extending from the upper inner surface.

3. The apparatus of claim 2, wherein the beam comprises a second side facing the lower inner surface of the body, and further comprising a second piezoelectric element fixed to the second side of the beam, the second piezoelectric element to generate a third voltage in response to flexion of the beam and further to generate a fourth voltage in response to compression of the second piezoelectric element against the lower inner surface of the body.

4. The apparatus of claim 3, wherein
    the lower inner surface comprises a second constraint member extending from the lower inner surface.

5. The apparatus of claim 3, wherein the first and second piezoelectric elements are comprised of bulk piezoelectric materials.

6. The apparatus of claim 5, wherein the first and second piezoelectric elements are comprised of ceramic piezoelectric materials.

7. The apparatus of claim 6, further comprising an energy storage circuit coupled to the first and second piezoelectric elements, the energy storage unit to receive the first and second voltages generated by the first piezoelectric element and the third and fourth voltages generated by the second piezoelectric element.

8. The apparatus of claim 7, further comprising a tire pressure sensor circuit coupled to the energy storage circuit, the apparatus to be mounted on an automobile wheel inside a tire, the beam to flex in response to accelerations imparted by the wheel.

9. The apparatus of claim 8, further comprising a mass at the second end of the beam.

10. The apparatus of claim 9, wherein the beam is comprised of metal.

11. The apparatus of claim 10, wherein the body is comprised of metal.

12. The apparatus of claim 10, wherein the body is comprised of plastic.

13. A system, comprising:
a sensor;
a radio transmitter coupled to the sensor, the radio transmitter to transmit information generated by the sensor;
an energy storage circuit coupled to the sensor and to the radio transmitter; and
a piezoelectric module coupled to the energy storage circuit, the piezoelectric module comprising
a body comprising a first inner end surface and an upper inner surface,
a beam comprising a first end and a second end, the first end fixed to the first inner surface of the body, the beam further comprising a first side facing the upper inner surface of the body, the beam to flex in response to accelerations imparted to the body, and
a first piezoelectric element fixed to the first side of the beam, the first piezoelectric element to generate a first voltage in response to flexion of the beam and further to generate a second voltage in response to compression of the first piezoelectric element against the upper inner surface of the body.

14. The system of claim 13, wherein the sensor comprises a tire pressure sensor, the radio transmitter to transmit tire pressure information generated by the tire pressure sensor.

15. The system of claim 13, wherein the body further comprises a lower inner surface, and wherein the upper inner surface comprises a first constraint member extending from the upper inner surface.

16. The system of claim 15, wherein the beam comprises a second side facing the lower inner surface of the body, and further comprising a second piezoelectric element fixed to the second side of the beam, the second piezoelectric element to generate a third voltage in response to flexion of the beam and further to generate a fourth voltage in response to compression of the second piezoelectric element against the lower inner surface of the body.

17. The system of claim 16, wherein
the lower inner surface comprises a second constraint member extending from the lower inner surface.

18. The system of claim 16, wherein the first and second piezoelectric elements are comprised of bulk piezoelectric materials.

19. The system of claim 18, wherein the first and second piezoelectric elements are comprised of ceramic piezoelectric materials.

20. The system of claim 19, further comprising a mass at the second end of the beam.

21. The system of claim 20, wherein the beam is comprised of metal.

22. The system of claim 21, wherein the body is comprised of metal, and wherein the first and second constraint members comprise an insulating material.

23. The system of claim 21, wherein the body is comprised of plastic.

24. A method, comprising:
flexing a beam and a piezoelectric element fixed to a first surface of the beam to generate a first voltage;
compressing the piezoelectric element against a constraint member of an inner surface of a body to generate a second voltage, a first end of the beam fixed to an inner end surface of the body; and
applying the first and second voltages to an energy storage circuit.

25. The method of claim 24, further comprising applying energy stored in the energy storage circuit to a sensor.

26. The method of claim 25, wherein said applying energy stored in the energy circuit to the sensor comprises applying energy stored in the energy circuit to a tire pressure sensor.

27. An apparatus, comprising:
means for flexing a beam and a piezoelectric element fixed to a first surface of the beam to generate a first voltage;
means for compressing the piezoelectric element against a constraint member of an inner surface of a body to generate a second voltage, a first end of the beam fixed to an inner end surface of the body; and
means for applying the first and second voltages to an energy storage circuit.

28. The apparatus of claim 27, further comprising means for applying energy stored in the energy storage circuit to a sensor.

29. The apparatus of claim 28, wherein said means for applying energy stored in the energy circuit to the sensor comprises means for applying energy stored in the energy circuit to a tire pressure sensor.

30. A wheel assembly, comprising:
a wheel; and
a tire pressure monitoring sensor fixed to the wheel and positioned such that if a tire is mounted on the wheel, the tire pressure monitoring sensor is exposed to an air pressure of the tire, wherein the tire pressure monitoring sensor comprises
a piezoelectric module comprising a piezoelectric element fixed to a first side of a beam having a first end fixed to a body of the piezoelectric module, the piezoelectric module to generate a voltage if the beam and the piezoelectric element are flexed in response to an acceleration imparted by the wheel to the piezoelectric module and to generate an additional voltage if the piezoelectric element is compressed against a constraint member of an inner surface of the body in response to the acceleration imparted by the wheel to the piezoelectric module.

* * * * *